US010797914B2

(12) United States Patent
Domanovitz et al.

(10) Patent No.: US 10,797,914 B2
(45) Date of Patent: Oct. 6, 2020

(54) ELEMENT MANAGEMENT SYSTEM FOR ANALOG AMPLIFIER WITHOUT CHANNEL MANAGEMENT (71) Applicant: ACTELIS NETWORKS (ISRAEL) LTD., Petach Tikva (IL)

(72) Inventors: Elad Domanovitz, Mazkeret Batya (IL); Oded Sinai, Kfar Haoranim (IL); Sarit Uval, Givataim (IL); Michal Winkler, Livingstone, NJ (US)

(73) Assignee: ACTELIS NETWORKS (ISRAEL) LTD., Petach Tikva (IL)

( * ) Notice: Subject to any disclaimer, the term of this patent is extended or adjusted under 35 U.S.C. 154(b) by 0 days.

(21) Appl. No.: 16/176,427

(22) Filed: Oct. 31, 2018

(65) Prior Publication Data
US 2019/0132161 A1 May 2, 2019

Related U.S. Application Data (60) Provisional application No. 62/579,170, filed on Oct. 31, 2017.

(51) Int. Cl.
*H04L 25/03* (2006.01)
*H04B 3/50* (2006.01)
*H04L 12/28* (2006.01)
*H04L 12/24* (2006.01)
*H03G 3/30* (2006.01)
*H04L 12/26* (2006.01)
*H03G 3/02* (2006.01)

(52) U.S. Cl.
CPC ......... *H04L 25/03847* (2013.01); *H04B 3/50* (2013.01); *H04L 12/2869* (2013.01); *H04L 12/2878* (2013.01); *H04L 41/0213* (2013.01); *H04L 41/082* (2013.01); *H03G 3/02* (2013.01); *H03G 3/3036* (2013.01); *H04L 43/50* (2013.01)

(58) Field of Classification Search
CPC ........... H04L 25/03847; H04L 12/2869; H04L 12/2878; H04L 41/0213; H04L 41/082; H04L 43/50; H04B 3/50; H03G 3/02; H03G 3/3036
See application file for complete search history.

(56) References Cited

U.S. PATENT DOCUMENTS

| | | | | |
|---|---|---|---|---|
| 7,061,987 B1* | 6/2006 | Tan | ......................... | H04L 5/023 375/260 |
| 7,187,907 B2* | 3/2007 | Widrow | .................... | H04B 3/36 455/282 |
| 7,194,023 B2* | 3/2007 | Norrell | ..................... | H04L 25/24 375/211 |
| 8,717,864 B2* | 5/2014 | Schenk | ..................... | H04B 3/32 370/201 |
| 2003/0016797 A1* | 1/2003 | Zakrzewski | ............ | H04L 47/10 379/93.32 |

(Continued)

*Primary Examiner* — Kibrom T Hailu
(74) *Attorney, Agent, or Firm* — Pearl Cohen Zedek Latzer Baratz LLP (57) ABSTRACT

A system and method are provided herein for managing an amplifier at an intermediate location in a twisted pair line between a digital subscriber line (DSL) access multiplexer and a customer premises equipment, for high data rate broadband operation. The system may include a DSL access multiplexer, an amplifier, a local communication interface and a host computer, programmed to execute an element management system service application.

5 Claims, 8 Drawing Sheets (56) References Cited

U.S. PATENT DOCUMENTS

2008/0080595 A1* 4/2008 Wang .................. H04B 3/36
375/211
2016/0021030 A1* 1/2016 Gerszberg ........... H04L 12/2856
370/420

* cited by examiner

ELEMENT MANAGEMENT SYSTEM FOR ANALOG AMPLIFIER WITHOUT CHANNEL MANAGEMENT

BACKGROUND OF THE INVENTION

This invention related generally to Digital Subscriber Line (DSL) technology, and more particularly directed to the architecture, operation and control of an analog amplifier along the telephone line.

DISCUSSION OF RELATED ART

Discrete Multitone (DMT) modems has initialization process, which is composed of the following phases:
Handshake (HS)
Channel discovery
Training
Channel analysis and exchange
When the initialization sequence is completed, data transmission (ShowTime) is initiated.

Figure 1:
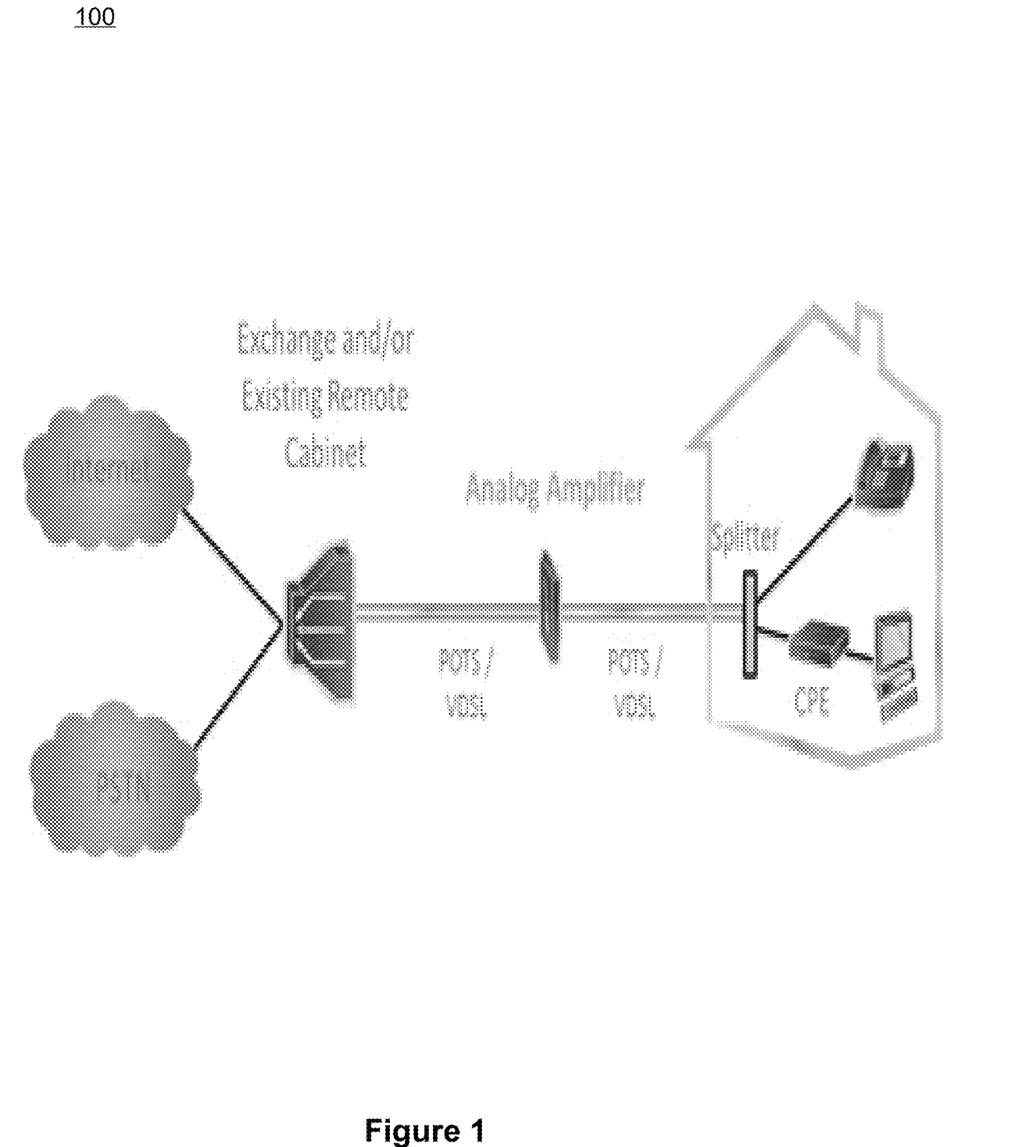
FIG. 1 is a schematic diagram of a DSL system, with an analog amplifier.

Analog amplification and regeneration are the two most common methods of dealing with increasing the signal power of DSL to enable greater reach (coverage) and bandwidth. An amplifier magnifies the signal without terminating it. Amplification is typically analog based. FIG. 1 is a schematic diagram presenting an analog amplifier located on a telephone line, which connects between DSL Access Multiplexer (DSLAM) and a Customer Premises Equipment (CPE), without having a direct management channel. DSLAM and CPE are coupled by twisted pairs. The DSLAM and the CPE perform high bit rate operations to send and receive digital operation.

There are several reasons for which such amplifier needs management, e.g.:
The system operator wants to know if there is an amplifier on the line
Software update is required
In case the amplifier has a changeable gain, calibration is needed when installed, and management may control the calibration.

One option for managing the amplifier is to use a direct management channel, e.g., implemented by using a dedicated modem in the DSLAM to connect to a dedicated modem in the enclosure of the amplifier which will control a single or a group of amplifiers. In this case, an additional power source at the amplifier is required to power the additional modem and one additional twisted-pair is wasted per CPE.

SUMMARY OF THE INVENTION

According to embodiments of the invention, there is provided a system for managing an amplifier at an intermediate location in a twisted pair line between a digital subscriber line (DSL) access multiplexer and a customer premises equipment for high data rate broadband operation, comprising: a DSL access multiplexer, an amplifier, a local communication interface and a host computer coupled to the local communication interface, to generate control command messages in response to each such user inputs and output information request messages at the local communication interface.

Some other embodiments of the present invention provide a method or managing an amplifier at an intermediate location in a twisted pair line between a digital subscriber line (DSL) Access Multiplexer and a customer premises equipment for high data rate broadband operation, comprising: receiving a command control message at a host computer, operating the host computer to communicate command control messages to said DSL access multiplexer over a local communications interface, responsive to receiving the command control messages, parsing the command control messages within an element management system software system agent, operating the element management system software agent to cause said DSL access multiplexer to initialize a corresponding activation sequence toward said amplifier, operating said amplifier to execute said activation sequence, and generating a reply message to the host computer over the local communications interface.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The present invention discloses a system for the management of an amplifier without a dedicated management channel.

Figure 2:
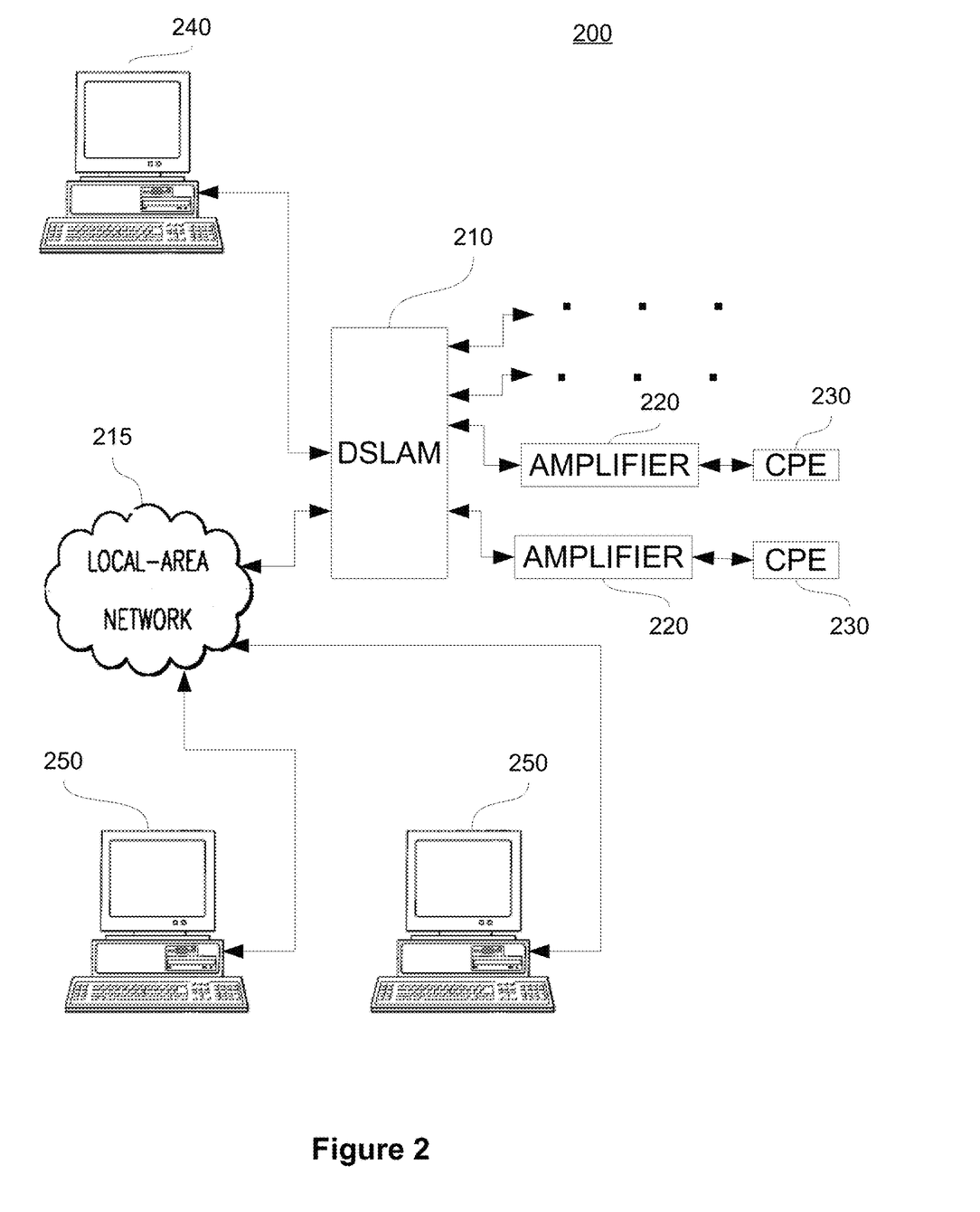
FIG. 2 is a block diagram of a DSL communication network into which an embodiment of the present invention may be implemented.

Referring to FIG. 2, a digital subscriber line (DSL) communications network 200 in which an embodiment of the present invention may be implemented will first be described.

As shown in FIG. 2, DSLAM 210 is in communication with a local network such as local area network (LAN) 215 at central office CO. According to this embodiment, DSLAM 210 is connected to host computer 240. Host computer 240 may be a personal computer, a workstation that is located physically near DSLAM 210 and is used to access and control system management functions of the analog amplifiers 220 within DSLAM 210. The host computer 240 is programmed to execute an element management system service application (not shown) to receive user inputs corresponding to management functions of the amplifiers 220 and generate control command messages in response to each such user inputs and output these control command messages at the local interface. Additional functionality of the DSLAM 210 is the control of the setup and operation of the amplifiers 220 as detailed later in further details, in response to the control command messages from host computer 240 or from user computers 250. User computers 250 are able to access DSLAM 210 in order to effect system management of the amplifiers 220, as described later in further details. Within DSLAM 210, an element management system software agent (not shown) communicates with the element management system service application in host computer 240. The element management system software agent includes a message parsing function to receive command messages from the element management service application that are directed to the management of the amplifiers 220.

In another embodiment, the functionality of the host computer 240 may be integrated into a management system of the DSLAM 210.

According to some embodiments, an operator is required to detect existence of amplifiers 220 on the telephone line between the DSLAM 210 and the CPE 230, without stopping the transmission over the telephone line. In this case, the assumptions are as follows:
- The amplifier has configurable gain curves in the upstream (US) and in the downstream (DS)
- The chosen US gain doesn't depend on the chosen DS gain and vice versa
- The optimal gain curves are equal to the inverse channel between the modem and the amplifier, such that the amplifier's output power will be equal to the original transmitted output.

Two possible methods are disclosed for amplifier detection based on different parameters which are defined in ITU-T G.993.2, Series G: Transmission Systems and Media Digital Systems and Network, January 2015.

Figure 3:
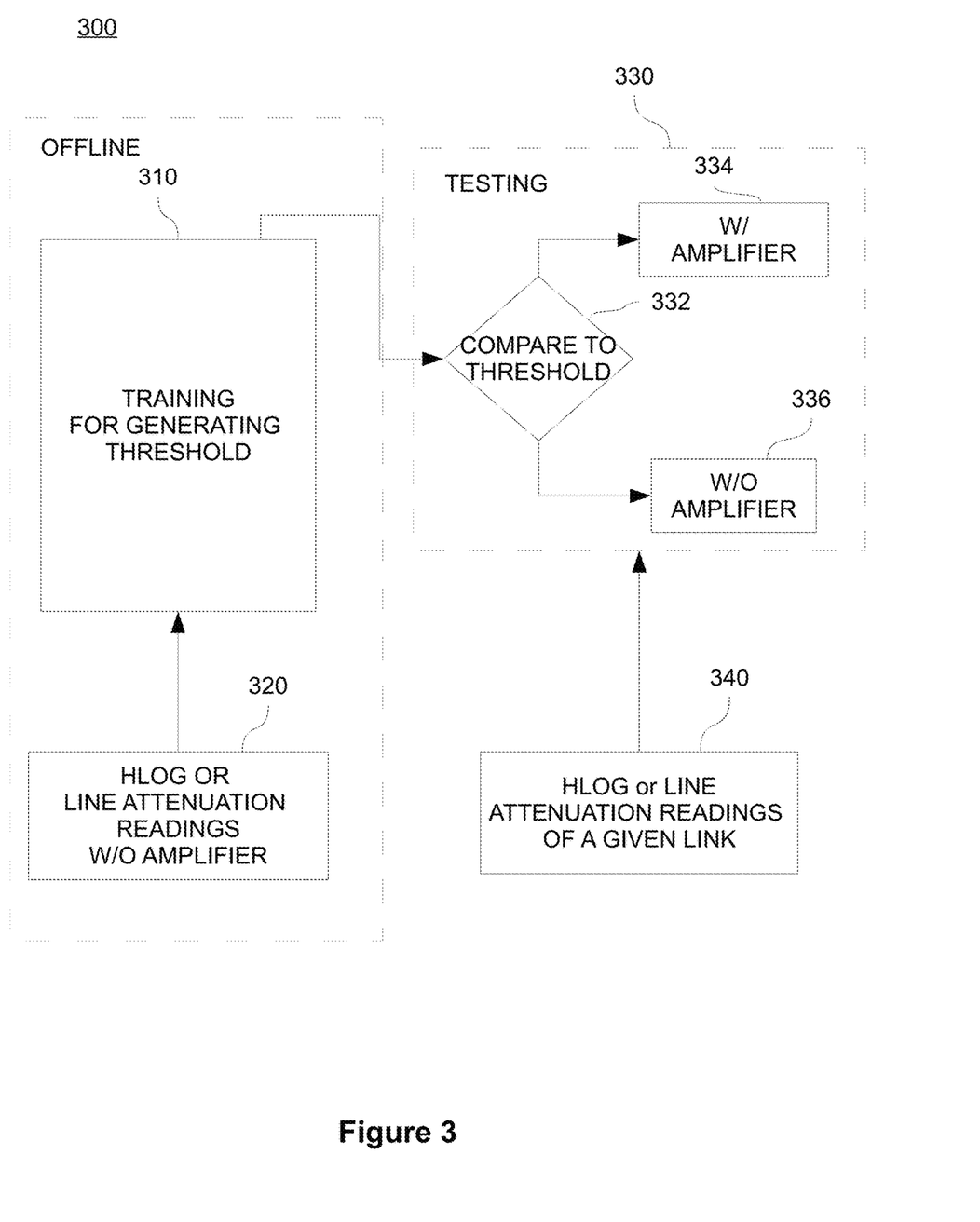
FIG. 3 conceptually illustrates a first exemplary embodiment of a method for amplifier existence identification.

According to one embodiment, the method is based on channel characteristics for desired loop conditioning applications which is defined in ITU-T G.993.2 standard section 11.4.1, as shown in FIG. 3.

Two formats for the channel characteristics are defined:
a. H lin(f): a format providing complex values on linear scale.
b. H log(f): a format providing values on a base 10 logarithm scale.

According to the standard, H log(f) shall be measured by the receive PMD (Physical Media Dependent) function during the loop diagnostic mode and initialization. The measurement shall not be updated during ShowTime. H log(f) shall be sent to the far-end VME (VDSL2 Management Entity) during the loop diagnostic mode and shall be sent on request to the near-end VME at any time. The near-end VME shall send H log(f) to the far-end VME on request during Showtime. H log(f) granularity is of 0.1 dB and the dynamic range is of approximately 102 dB.

According to table 11-42 in ITU-T G.993.2 standard, the H log readings are given on the supported subcarriers only, i.e., H log reading in the US is given only on the US bins, and H log reading in the DS is given only on the DS bins. For that matter, if there is no amplifier in the line, the US H log and the DS H log will have the same slope.

TABLE 11-42

Value of G for various phases of operation

| Test parameter | Normal operation Showtime | Loop diagnostic mode | |
|---|---|---|---|
| | | Channel discovery | Channel analysis and exchange |
| QLN | SUPPORTEDCARRIERS | SUPPORTEDCARRIERS | N/A |
| HLOG | SUPPORTEDCARRIERS | SUPPORTEDCARRIERS | N/A |
| HLIN | N/A | N/A | MEDLEY |
| SNR | MEDLEY | N/A | MEDLEY |

Valid values of G are 1, 2, 4 and 8.

When there is an amplifier in the line, with optimal gain curves as specified above in the assumptions, the US an DS H log readings are different, except the case where L1=L2, where L1 is the distance from the amplifier to the DSLAM and L2 is the distance from the amplifier to the CPE. For example, when L1=3L2, the US optimal amplification is equal to $(H_{L_1})^{-1}=(3 \cdot H_{L_2})^{-1}$. In such case, the H log on both sides is:

$$H \log_{US} = H_{L_1} \cdot H_{L_2} \cdot (H_{L_2})^{-1} = H_{L_1} = 3 \cdot H_{L_2}$$

$$H \log_{DS} = H_{L_1} \cdot H_{L_2} \cdot (H_{L_1})^{-1} = H_{L_2}$$

i.e., the readings on each side is different.

Detecting the existence of different slopes in the H log clarifies that there is an amplifier in the loop, as per step 334.

Figure 4:
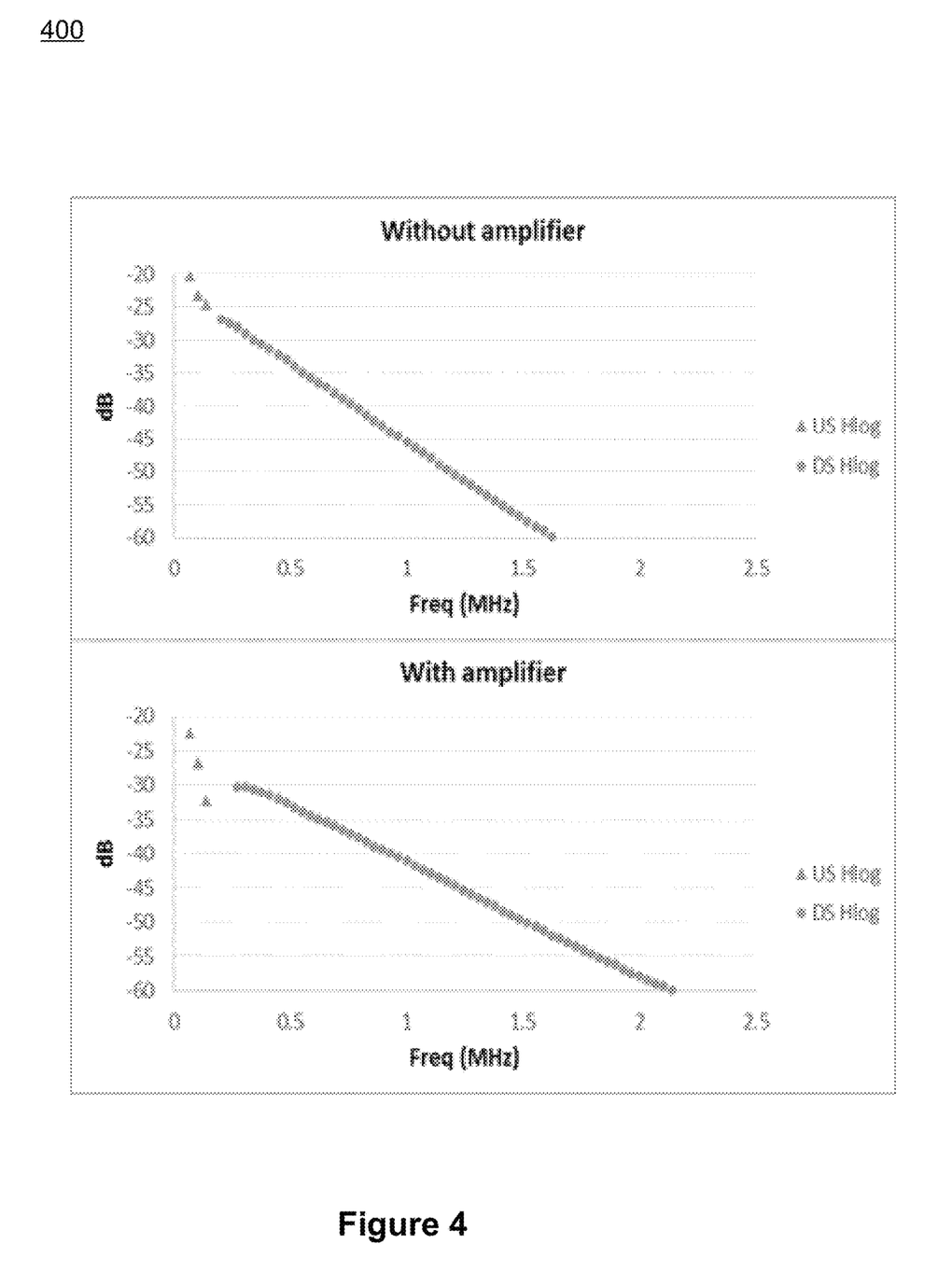
FIG. 4 illustrates an example of upstream (US) and downstream (DS) H log readings.

According to some other embodiments, the detection of the existence of an amplifier is based on the fact that some bands are not amplified at all in some variants of the amplifier, hence detection is possible even if L1=L2. An example is presented in FIG. 4.

An example of a method for detecting the existence of an amplifier on the line, based on channel characteristics, is as follows:
Compare the slope of the H log measured in US0 to the slope of H log measured in DS1
If the slopes are similar (up to predefined threshold) declare that there is amplifier in the line.
If the slopes are different, declare that there is an amplifier in the line.

According to another embodiment, the method for amplifier detection is based on the loop attenuation per band which the DSLAM reports. According to ITU-T Standard G.993.2:

"The loop attenuation of the mth band is the squared magnitude of the channel characteristics function H(f) averaged over all subcarriers of the mth band, converted to dB".

Therefore, the loop attenuation per band is different in each band (US0, US1, US2, . . . DS1, DS2, DS3, . . . ). Since H(f) changes when having an amplifier in the line, also the loop attenuation per band changes when having an amplifier in the line.

Figure 5:
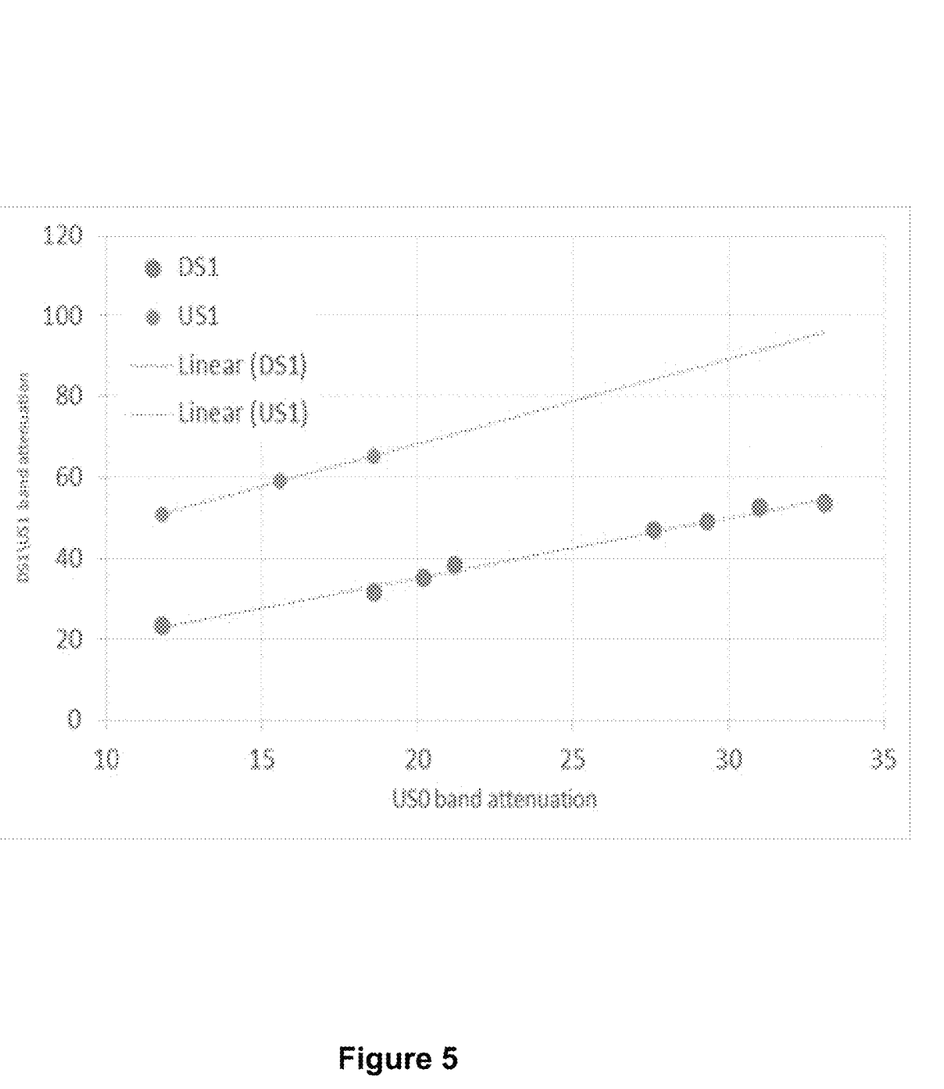
FIG. 5 illustrates an example of band attenuation DSLAM's reports and linear trend lines.

Without amplifier DS1 attenuation vs. US0 attenuation, per loop length, creates a linear function, as well as US1 attenuation vs. US0 attenuation. Example of a real measurement presented in FIG. 5.

Figure 6:
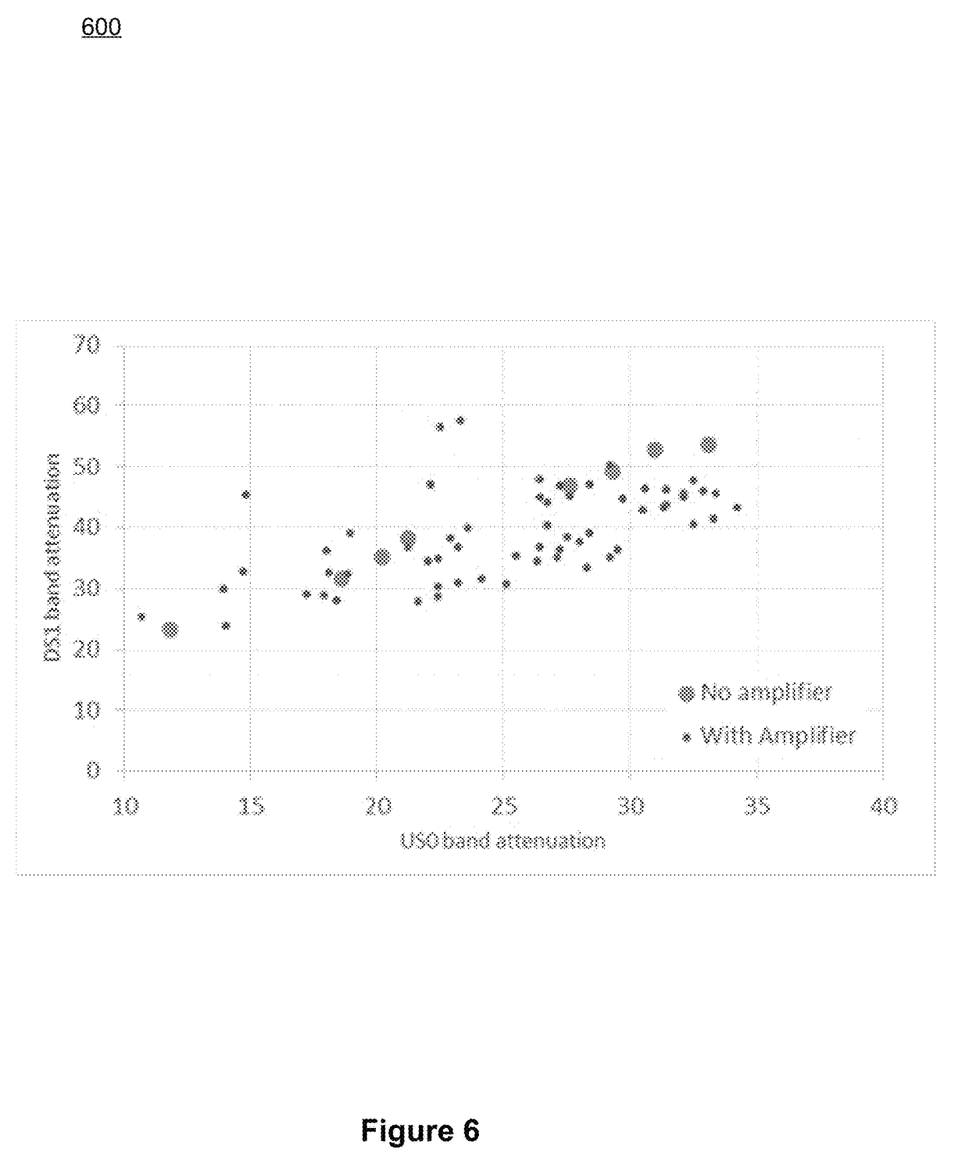
FIG. 6 illustrates an example for DS1 vs. US0 band attenuation, with and without an amplifier installed in the line

As shown in FIG. 6, when an amplifier is installed in the line, the US1 vs US0 and DS1 vs US0 values are not placed on the same linear graph. In such case, a preconfigured threshold may be set, to detect if a given band attenuation readings indicate if the line includes an amplifier.

An example of a method for detecting the existence of an amplifier on the line, based on loop attenuation, is as follows:

Training stage (step 310, FIG. 3): in this stage, two linear functions (based on a graph like FIG. 5) are calculated, without an amplifier in the line: US1 vs. US0 and DS1 vs. US0

Testing stage (per step 330, FIG. 3):

Activate the line

Read US0, US1 and DS1 band attenuation

If US1 vs. US0 value and DS1 vs. US0 value are both close enough to the appropriate linear line, the conclusion is that there is no amplifier in the line, as shown at step 336, FIG. 3; otherwise the conclusion is that there is an amplifier in the line as shown at step 334, FIG. 3.

According to some embodiments, full management of the amplifier is needed. A method for establishing a protocol between the DSLAM 210 and the amplifier 220 is disclosed, which is based on DSLAM signaling. In the embodiment which includes a host processor, the control and management functions of the amplifier are carried out by the DSLAM 210, in response to control command messages from host computer 240, or from user computers 250, using a known management protocol such as Open Mobile Alliance (OMA) management protocol or Simple Network Management Protocol (SNMP). The DSLAM 210 parses the control command messages and translates them into a known activation sequence which is also known at the amplifier 220. An example used for the software download procedure is presented at FIG. 7.

Figure 7:
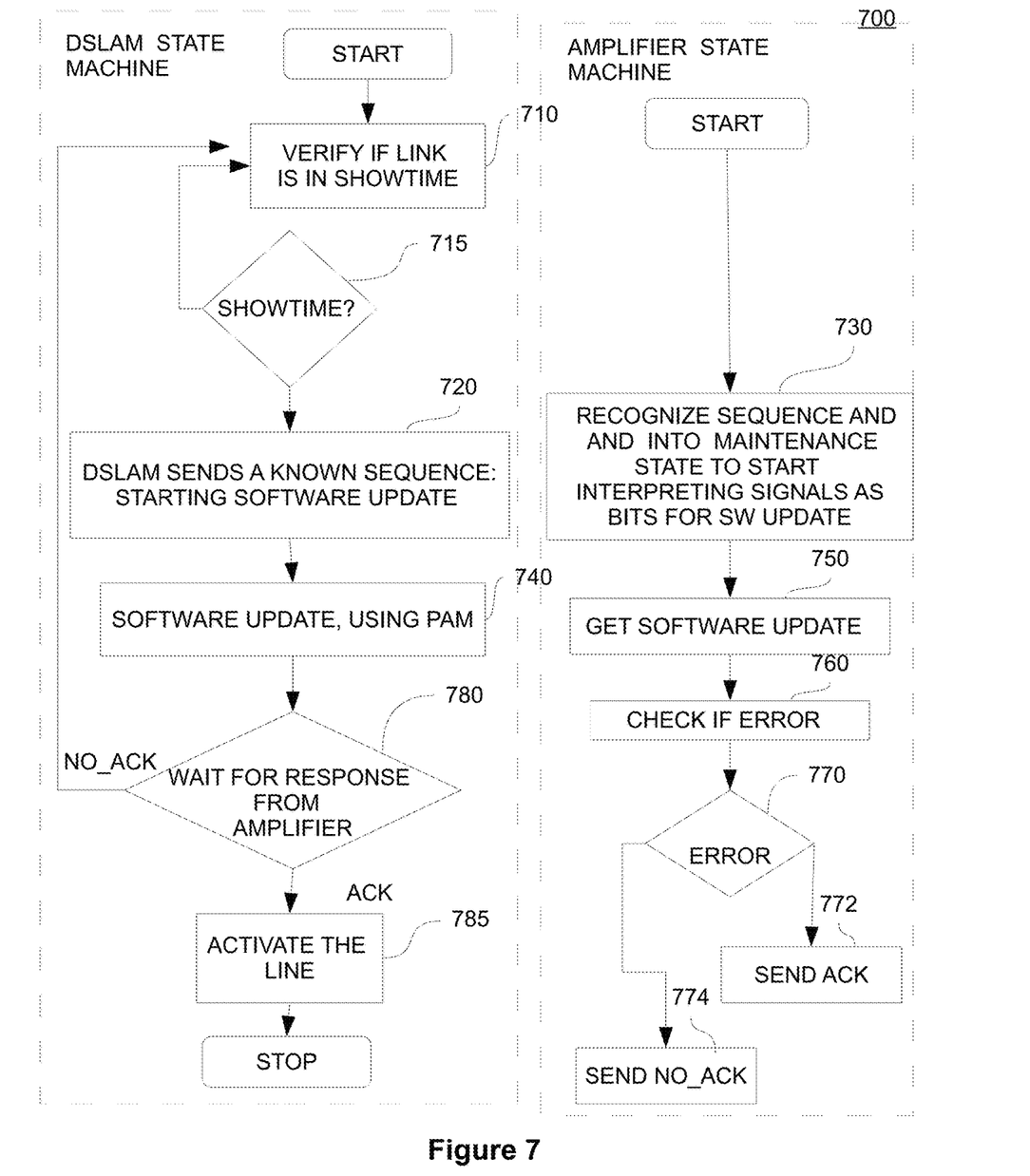
FIG. 7 is a block diagram of a method for software download to the amplifier into which an embodiment of the present invention may be implemented.

As shown in FIG. 7, the DSLAM 210 checks if the desired line is UP (or in ShowTime) as per step 710. Next, the DSLAM signals the amplifier to go into "receive data" mode. An example for such signaling is performing predefined set of activations/link failures by DSLAM 210, i.e., shutting down and activating the line X times consecutively in a preconfigured time period, where X is a preconfigured parameter, as per step 720. Once the amplifier 220 is detecting such sequence, the amplifier is entering into maintenance mode as per step 730 and start interpreting signals coming from the DSLAM 210 as bits for the software update (SW update), forcing state change or any other operation which was pre-defined to be done remotely on the amplifier.

Figure 8:
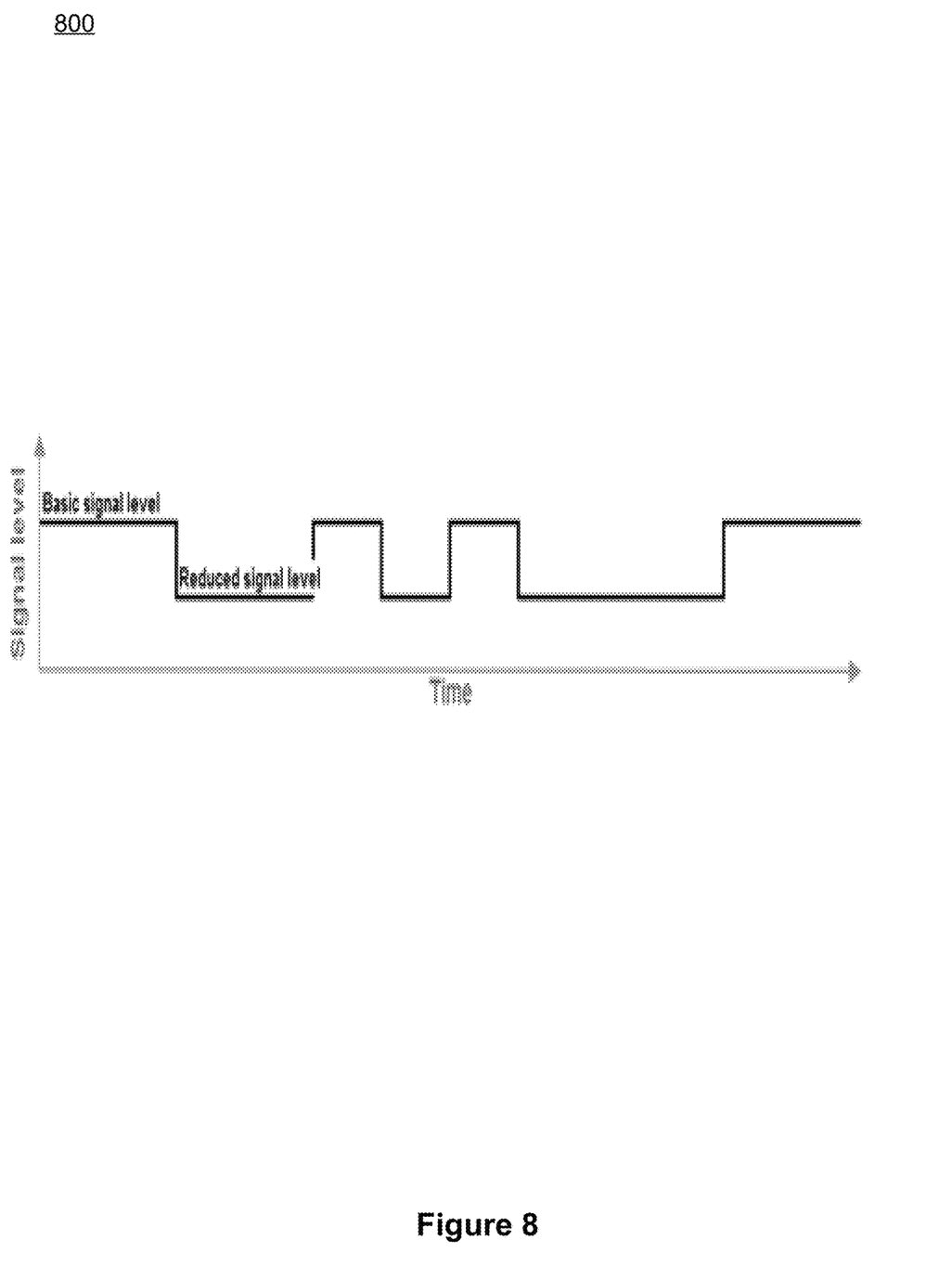
FIG. 8 illustrates an example for a Pulse Amplitude Modulation (PAM) sequence.

DSLAM 210 sends Pulse Amplitude Modulation (PAM) sequences which includes two signal levels as per step 740, dependent on the software update bits (e.g. bit 0 in the SW update is translated to certain signal level, bit 1 in the SW update are translated to another signal level). Each time, the modem needs to change the level, it should configure its power spectral density (PSD) and start another activation. During all this period, amplifier 220 should save the received signal level as per step 750. An example for using 2-PAM is presented at FIG. 8.

In another embodiment, higher granularity PAM (4-PAM or higher) can be used. The granularity of the modulation (i.e., number of pulses possible) is set by DSLAM 210 based on the channel parameters (line rate, noise margin, loop attenuation) and the amplifier needs to be able to identify (either blindly or by sending preamble) the level of the PAM in order to perform accurate detection.

In another embodiment, the signaling is done by the DSLAM by activation of the line with different levels of power back off (PBO). The amplifier compares the power level it detects to the power level of a normal activation and deduce bits from the difference in the level. For example, normal signal level can be interpreted as "1" while half signal level van be interpreted as "0".

In another embodiment, when the amplifier is not fed from power drawn from the line (either fed locally or by express power, i.e., power drawn for several amplifier from dedicated pair), the signaling can be done by turning on and off power on the line. For example, power can be assigned to the line for X time slots which are followed by a time slot without power. The amplifier measure how much time it "sees" power on the line and convert it to bits.

Once all the SW update is received, DSLAM 210 performs standard activation (with non-attenuated PSD). Amplifier 220 checks for error identification code as shown in step 760. If there are no errors, amplifier 220 sends an acknowledgment sequence, e.g., Y (preconfigured parameter) consecutive times of cutting off the line in a preconfigured time period, and then stay on the Y+1 time, as shown at step 772, else amplifier 220 sends a different sequence to DSLAM 210 indicating no acknowledgment as shown at step 774. DSLAM 210 recognizes the sequence and in case it indicates an acknowledge, the line is activating with the new software as per step 785.

While certain features of the invention have been illustrated, and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A system for managing an amplifier at an intermediate location along a twisted pair line between a digital subscriber line (DSL) access multiplexer and a customer premises equipment for high data rate broadband operation, comprising:
    a DSL access multiplexer;
    an amplifier;
    a local communications interface;
    a host computer, coupled to the local communications interface, programmed to execute an element management system service application to receive user inputs corresponding to control and management functions of said amplifier, to generate control command messages in response to each such user inputs, and output said control command messages at the local communications interface,
    wherein the DSL Access Multiplexer is configured to detect an existence of said amplifier along said along said twisted pair line, by comparing readings associated with said twisted pair line to values prescribed at ITU-T G.993.2 standard for an in-line amplifier, wherein the DSL Access Multiplexer is configured to perform the control and management functions of said amplifier in response to said control command messages from said local communications interface and for generating reply messages to the local communications interface responsive to said control command messages, and wherein said amplifier is configured to perform operations corresponding to signals received from said DSL access multiplexer, and wherein said signals received from said DSL access multiplexer by the amplifier are given at either Open Mobile Alliance (OMA) management protocol or a Simple Network Management Protocol (SNMP).

2. The system according to claim 1, wherein said element management system service application is integrated into a management system of said DSL access multiplexer.

3. The system according to claim 1, wherein said management service application comprise at least one of the following services:
   detection of existence of said amplifier,
   software download to said amplifier, and
   control and management of calibration of said amplifier.

4. A method for managing an amplifier at an intermediate location along a twisted pair line between a digital subscriber line (DSL) Access Multiplexer and a customer premises equipment for high data rate broadband operation, comprising the steps of:
   receiving a command control message at a host computer;
   operating the host computer to communicate command control messages to said DSL access multiplexer over a local communications interface;
   responsive to receiving the command control messages, parsing the command control messages within an element management system software system agent;
   operating the element management system software agent to cause said DSL access multiplexer to initialize a corresponding activation sequence toward said amplifier;
   operating said amplifier to execute said activation sequence; and
   generating a reply message to the host computer over the local communications interface,
   wherein the DSL Access Multiplexer is configured to detect an existence of said amplifier along said along said twisted pair line, by comparing readings associated with said twisted pair line to values prescribed at ITU-T G.993.2 standard for an in-line amplifier, and
   wherein said corresponding activation sequence is given at either Open Mobile Alliance (OMA) management protocol or a Simple Network Management Protocol (SNMP).

5. The method of claim 4, wherein the command control messages comprise at least one of the following requests:
   detection of existence of said amplifier,
   software download to said amplifier, and
   control and management of calibration of said amplifier.

* * * * *